United States Patent
Kang et al.

(10) Patent No.: US 10,752,719 B2
(45) Date of Patent: Aug. 25, 2020

(54) COMPOSITION FOR SOFT MOLD AND SOFT MOLD MANUFACTURED BY USING THE COMPOSITION

(71) Applicant: Samsung Display Co., Ltd., Yongin-si, Gyeonggi-do (KR)

(72) Inventors: Minhyuck Kang, Seoul (KR); Yukihiro Miyazawa, Asan-si (KR); Myeonghee Kim, Yongin-si (KR); Jungwoo Park, Seoul (KR); Atsushi Takakuwa, Hwaseong-si (KR); Gugrae Jo, Asan-si (KR); Kangsoo Han, Seoul (KR)

(73) Assignee: Samsung Display Co., Ltd. (KR)

( * ) Notice: Subject to any disclaimer, the term of this patent is extended or adjusted under 35 U.S.C. 154(b) by 32 days.

(21) Appl. No.: 15/804,135

(22) Filed: Nov. 6, 2017

(65) Prior Publication Data
US 2018/0298134 A1 Oct. 18, 2018

(30) Foreign Application Priority Data
Apr. 14, 2017 (KR) .................. 10-2017-0048742

(51) Int. Cl.
| | |
|---|---|
| *C08F 222/20* | (2006.01) |
| *B29C 33/40* | (2006.01) |
| *G03F 7/00* | (2006.01) |
| *C08F 222/10* | (2006.01) |
| *B29C 33/42* | (2006.01) |

(52) U.S. Cl.
CPC ............ *C08F 222/20* (2013.01); *B29C 33/40* (2013.01); *C08F 222/1006* (2013.01); *G03F 7/0002* (2013.01); *B29C 33/424* (2013.01); *B29K 2833/04* (2013.01)

(58) Field of Classification Search
CPC .............. C08F 222/20; C08F 222/1006; C08F 222/103; C08F 230/08; C08F 4/00; B29C 33/40; B29C 33/424; G03F 7/0002; B29K 2833/04
See application file for complete search history.

(56) References Cited

U.S. PATENT DOCUMENTS

| | | |
|---|---|---|
| 8,637,587 B2 | 1/2014 | Xu et al. |
| 9,533,467 B2 | 1/2017 | Kobayashi et al. |
| 2010/0255268 A1 | 10/2010 | Choi et al. |
| 2013/0049255 A1 | 2/2013 | Matsumoto et al. |
| 2013/0075962 A1 | 3/2013 | Jigami et al. |
| 2015/0240015 A1 | 8/2015 | Yamada et al. |
| 2015/0368453 A1 | 12/2015 | Wada et al. |
| 2016/0193756 A1 | 7/2016 | Oshima et al. |

FOREIGN PATENT DOCUMENTS

| | | |
|---|---|---|
| JP | 2008019292 A | 1/2008 |
| KR | 100902550 | 6/2009 |
| KR | 100929381 | 12/2009 |
| KR | 101132372 | 3/2011 |
| KR | 101381489 | 4/2014 |
| KR | 1020150004406 | 1/2015 |
| WO | 99/09107 A1 | 2/1999 |

OTHER PUBLICATIONS

Synthesis, Characterization, and UV-Curing Properties of Silicon-Containing (Meth)acrylate Monomers, Journal of Applied Polymer Science, (C) 2013 Wiley Periodicals, Inc., www.MATERiALSVIEWS. COM, wileyonlinelibrary.com/app, J. Appl Polym. Sci. 2013, DOI:10. 1002/APP.38943, pp. 3325-3332, Siyuan Wang, Yingquan Zou, College of Chemistry, Beijing Normal University, Haidian District, Beijing 100875, China, Correspondence to: Y. Q. Zou (E-mail: zouyq@263.net).

*Primary Examiner* — Sanza L. McClendon
(74) *Attorney, Agent, or Firm* — Innovation Counsel LLP

(57) ABSTRACT

A composition for a soft mold according to an embodiment of the inventive concept may manufacture a soft mold having good durability and release properties by including at least one multifunctional acrylate monomer, at least one photoinitiator, and a siloxane compound, and may improve productivity in the manufacture of an optical member by using the soft mold.

21 Claims, 11 Drawing Sheets

500nm

I                                    I'

500nm

II                II'

COMPOSITION FOR SOFT MOLD AND SOFT MOLD MANUFACTURED BY USING THE COMPOSITION

CROSS-REFERENCE TO RELATED APPLICATIONS

This U.S. non-provisional patent application claims priority under 35 U.S.C. § 119 to Korean Patent Application No. 10-2017-0048742, filed on Apr. 14, 2017, the entire contents of which are hereby incorporated by reference.

BACKGROUND

The present disclosure herein relates to compositions for a soft mold and soft molds manufactured by using the compositions, and more particularly, to compositions for manufacturing a soft mold used in a nano-imprint process and soft molds manufactured by using the compositions.

A various method is being used as a method of manufacturing an optical member having a fine pattern or forming an optical pattern included in a display device. In particular, a nano-imprint method is being used as a method of forming a micro-sized or nano-sized fine optical pattern in an optical member or a display device.

With respect to the nano-imprint method, a soft mold is used in an intermediate step for the formation of the optical pattern. In order to form a precise optical pattern using the soft mold and increase productivity during the manufacture of the optical member, research to improve durability and release properties of the soft mold has been conducted.

SUMMARY

The present disclosure provides a composition for a soft mold for manufacturing a soft mold having good release properties even after repeated use and high durability, and a soft mold manufactured by using the composition.

An embodiment of the inventive concept provides a composition for a soft mold including: 40 wt % or more to 96 wt % or less of at least one multifunctional acrylate monomer based on a total weight of the composition for the soft mold; 3 wt % or more to 15 wt % or less of at least one photoinitiator based on the total weight of the composition for the soft mold; and 0.1 wt % or more to 50 wt % or less of a siloxane compound based on the total weight of the composition for the soft mold.

In an embodiment, the at least one multifunctional acrylate monomer may include a first acrylate monomer having three or more acrylate groups.

In an embodiment, the at least one multifunctional acrylate monomer may further include a second acrylate monomer having two acrylate groups.

In an embodiment, the at least one multifunctional acrylate monomer may include at least one selected from the group consisting of trimethylolpropane triacrylate, trimethylolpropane ethoxylate triacrylate, trimethylolpropane propoxylate triacrylate, ethoxylated glycerine triacrylate, glycerine (PO)m triacrylate (where m is an integer of 1 or more to 4 or less), pentaerythritol triacrylate, tris(2-hydroxyethyl)isocyanurate triacrylate, pentaerythritol (EO)n tetraacrylate (where n is an integer of 1 or more to 4 or less), ditrimethylolpropane tetraacrylate, pentaerythritol tetraacrylate, dipentaerythritol pentaacrylate, and dipentaerythritol hexaacrylate.

In an embodiment, the at least one multifunctional acrylate monomer may further include at least one selected from the group consisting of 1,4-butanediol diacrylate, 1,6-hexanediol diacrylate, 1,9-nonanediol diacrylate, 1,10-decanediol diacrylate, 1,6-hexanediol (EO)n diacrylate (where n is an integer of 1 or more to 4 or less), hydroxy pivalic acid neopentyl glycol diacrylate, dipropylene glycol diacrylate, tripropylene glycol diacrylate, polypropylene glycol diacrylate, diethylene glycol diacrylate, triethylene glycol diacrylate, tetraethylene glycol diacrylate, and polyethylene glycol diacrylate.

In an embodiment, the at least one multifunctional acrylate monomer may include trimethylolpropane ethoxylate triacrylate and trimethylolpropane triacrylate.

In an embodiment, the at least one multifunctional acrylate monomer may further include dipropylene glycol diacrylate.

In an embodiment, the at least one photoinitiator may include a first photoinitiator activated by a first ultraviolet light; and a second photoinitiator activated by a second ultraviolet light having a wavelength longer than that of the first ultraviolet light.

In an embodiment, a ratio of the first photoinitiator to the second photoinitiator may be in a range of 1:1 to 2:1.

In an embodiment, the first photoinitiator may be one selected from the group consisting of 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, 2-hydroxy-1-{4-[4-(2-hydroxy-2-methyl-propionyl)-benzyl]-phenyl}-2-methylpropan-1-one, and a combination thereof.

In an embodiment, the second photoinitiator may be one selected from the group consisting of 2-methyl-1[4-(methylthio)phenyl]-2-morpholinopropan-1-one, 2-benzyl-2-dimethylamino-1-(4-morpholinophenyl)-butanone-1,2-dimethylamino-2-(4-methyl-benzyl)-1-(4-morpholin-4-yl-phenyl)-butan-1-one, 2,4,6-trimethylbenzoyl-diphenylphosphine oxide, 2,4,6-trimethylbenzoyl-diphenyl phosphinate, bis(2,4,6-trimethylbenzoyl)-phenylphosphine oxide, [1-(4-phenylsulfanylbenzoyl)heptylideneamino]benzoate, [1-[9-ethyl-6-(2-methylbenzoyl)carbazol-3-yl]ethylideneamino] acetate, bis(2,4-cyclopentadienyl)bis[2,6-difluoro-3-(1-pyrryl)phenyl]titanium(IV), and a combination thereof.

In an embodiment, the at least one photoinitiator may include an alkylphenone-based first photoinitiator and an acylphosphineoxide-based second photoinitiator.

In an embodiment, the at least one photoinitiator may include 1-hydroxy-cyclohexyl-phenyl-ketone and bis(2,4,6-trimethylbenzoyl)-phenylphosphine oxide.

In an embodiment, the siloxane compound may have an acrylate group as an end group.

In an embodiment, the composition for a soft mold may include 80 wt % or more to 96 wt % or less of the at least one multifunctional acrylate monomer based on the total weight of the composition for the soft mold; 5 wt % or more to 15 wt % or less of the at least one photoinitiator based on the total weight of the composition for the soft mold; and 2 wt % or more to 10 wt % or less of the siloxane compound based on the total weight of the composition for the soft mold.

In an embodiment, the composition for a soft mold may further include a phosphonic acid.

In an embodiment of the inventive concept, a composition for a soft mold includes: at least one acrylate monomer having a plurality of acrylate groups; a first photoinitiator activated by a first wavelength; a second photoinitiator activated by a second wavelength longer than the first wavelength; and a siloxane compound represented by Formula 1:

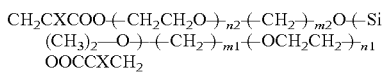
[Formula 1]

wherein, in Formula 1, X is hydrogen or a methyl group, m1 and m2 are each independently an integer of 2 or more to 30 or less, and n1 and n2 are each independently an integer of 0 or more to 5 or less.

In an embodiment, the siloxane compound may be represented by Formula 1-1:

[Formula 1-1]

wherein, in Formula 1-1, m1, m2, n1, and n2 are the same as defined in Formula 1.

In an embodiment, the siloxane compound may be represented by Formula 1-2:

[Formula 1-2]

wherein, in Formula 1-2, m1, m2, n1, and n2 are the same as defined in Formula 1.

In an embodiment, the siloxane compound may be represented by Formula 1-3:

[Formula 1-3]

In an embodiment, the composition for a soft mold may include: 40 wt % or more to 96 wt % or less of the at least one acrylate monomer based on a total weight of the composition for the soft mold; 1.5 wt % or more to 12 wt % or less of the first photoinitiator based on the total weight of the composition for the soft mold; 1.5 wt % or more to 3 wt % or less of the second photoinitiator based on the total weight of the composition for the soft mold; and 0.1 wt % or more to 50 wt % or less of the siloxane compound based on the total weight of the composition for the soft mold.

In an embodiment of the inventive concept, a soft mold includes an uneven pattern having a plurality of recesses, wherein the uneven pattern is manufactured by using a composition for a soft mold which includes 40 wt % or more to 96 wt % or less of at least one multifunctional acrylate monomer based on a total weight of the composition; 3 wt % or more to 15 wt % or less of at least one photoinitiator based on the total weight of the composition; and 0.1 wt % or more to 50 wt % or less of a siloxane compound based on the total weight of the composition.

In an embodiment, the siloxane compound may be represented by Formula 1:

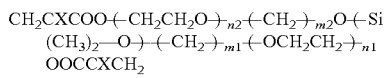
[Formula 1]

wherein, in Formula 1, X is hydrogen or a methyl group, m1 and m2 are each independently an integer of 2 or more to 30 or less, and n1 and n2 are each independently an integer of 0 or more to 5 or less.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

Figure 1A:
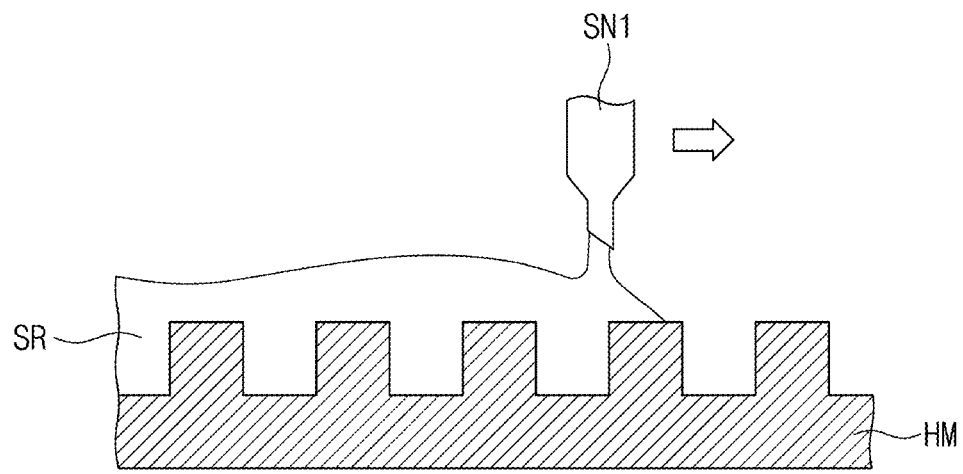
FIGS. 1A, 1B, 1C and 1D are schematic views illustrating steps of manufacturing a soft mold according to an embodiment of the inventive concept.

While the inventive concept is amenable to various modifications and alternative forms, specific embodiments have been shown by way of example in the drawings and are described in detail below. The intention, however, is not to limit the inventive concept to the particular embodiments described. On the contrary, the inventive concept is intended to cover all modifications, equivalents, and alternatives falling within the scope of the inventive concept as defined by the appended claims.

In the drawings, like numbers refer to like elements throughout. In the accompanying drawings, the dimensions of structures are exaggerated for clarity. It will be understood that, although the terms first, second, etc. may be used herein to describe various elements, these elements should not be limited by these terms. These terms are only used to distinguish one element from another element. For example, a first element could be termed a second element, and, similarly, a second element could be termed a first element, without departing from the scope of the inventive concept. The terms of a singular form may include plural forms unless referred to the contrary.

It will be further understood that the terms "includes" and/or "including", when used in this specification, specify the presence of stated features, integers, steps, operations, elements, components, or combinations thereof, but do not preclude the presence or addition of one or more other features, integers, steps, operations, elements, components, or combinations thereof. Also, it will be understood that when an element such as a layer, film, region, or substrate is referred to as being "on" another element, it can be directly on the other element or intervening elements may also be present therebetween.

Hereinafter, a composition for a soft mold according to an embodiment of the inventive concept will be described. The composition for a soft mold according to the embodiment of the inventive concept may include at least one multifunctional acrylate monomer, at least one photoinitiator, and a siloxane material.

In an embodiment, the composition for a soft mold may include one multifunctional acrylate monomer or a plurality of multifunctional acrylate monomers.

The composition for a soft mold according to the embodiment of the inventive concept may include about 40 wt % or more to about 96 wt % or less of the multifunctional acrylate monomer based on a total weight of the composition for a soft mold. For example, the composition for a soft mold according to the embodiment may include about 40 wt % or more to about 96 wt % or less of one multifunctional acrylate monomer. Also, in an embodiment, a sum of weights of the plurality of multifunctional acrylate monomers may be about 40 wt % or more to about 96 wt % or less based on the total weight of the composition for a soft mold.

The multifunctional acrylate monomer included in the composition for a soft mold according to the embodiment may have a plurality of acrylate groups in one repeating unit. The multifunctional acrylate monomer may have two or more acrylate groups in one repeating unit.

For example, the multifunctional acrylate monomer may be diacrylate having two acrylate groups, triacrylate having three acrylate groups, tetraacrylate having four or more acrylate groups, pentaacrylate, or hexaacrylate, but the embodiment of the inventive concept is not limited thereto.

The composition for a soft mold according to the embodiment may not include a monofunctional acrylate monomer. For example, the monofunctional acrylate monomer may include one acrylate group in one monomer repeating unit.

That is, the composition for a soft mold according to the embodiment may not include the monofunctional acrylate monomer having one acrylate group, and may include the multifunctional acrylate monomer having the plurality of acrylate groups, for example, two or more acrylate groups.

The composition for a soft mold according to the embodiment may include the plurality of multifunctional acrylate monomers. The composition for a soft mold according to the embodiment may include a first acrylate monomer having three or more acrylate groups. Also, the composition for a soft mold according to the embodiment may include a plurality of the first acrylate monomers having three or more acrylate groups.

The composition for a soft mold according to the embodiment may further include a second acrylate monomer having two acrylate groups in addition to at least one first acrylate monomer.

The first acrylate monomer having three or more acrylate groups may be at least one selected from the group consisting of trimethylolpropane triacrylate, trimethylolpropane ethoxylate triacrylate, trimethylolpropane propoxylate triacrylate, ethoxylated glycerine triacrylate, glycerine (PO)m triacrylate, pentaerythritol triacrylate, tris(2-hydroxyethyl) isocyanurate triacrylate, pentaerythritol (EO)n tetraacrylate, ditrimethylolpropane tetraacrylate, pentaerythritol tetraacrylate, dipentaerythritol pentaacrylate, and dipentaerythritol hexaacrylate. However, the embodiment of the inventive concept is not limited thereto.

In an ethoxylate (EO)-modified or propoxylate (PO)-modified multifunctional acrylate monomer, the number of repeating units of EO or PO modification may be 4 or less. For example, glycerine (PO)m triacrylate may be PO-modified glycerine triacrylate, and pentaerythritol (EO)n tetraacrylate may be EO-modified pentaerythritol tetraacrylate. Herein, repeating units m and n in (PO)m and (EO)n may each independently be an integer of 4 or less.

In a case in which the multifunctional acrylate monomer included in the composition for a soft mold according to the embodiment is an EO-modified or PO-modified multifunctional acrylate monomer, the number of substituted modification units may be 4 or less. In a case in which the number of EO or PO modification units is 5 or more, a modulus of a soft mold manufactured by using the multifunctional acrylate monomer may be reduced, and durability and chemical resistance may be reduced too.

The first acrylate monomer may include trimethylolpropane ethoxylate triacrylate (EO=3) and trimethylolpropane triacrylate as acrylate groups.

The second acrylate monomer having two acrylate groups may be at least one selected from the group consisting of 1,4-butanediol diacrylate, 1,6-hexanediol diacrylate, 1,9-nonanediol diacrylate, 1,10-decanediol diacrylate, 1,6-hexanediol (EO)n diacrylate, hydroxy pivalic acid neopentyl glycol diacrylate, dipropylene glycol diacrylate, tripropylene glycol diacrylate, polypropylene glycol diacrylate, diethylene glycol diacrylate, triethylene glycol diacrylate, tetraethylene glycol diacrylate, and polyethylene glycol diacrylate. However, the embodiment of the inventive concept is not limited thereto.

The composition for a soft mold according to the embodiment may include two first acrylate monomers as acrylate groups. For example, the composition for a soft mold according to the embodiment may include trimethylolpropane ethoxylate triacrylate (EO=3) and trimethylolpropane triacrylate. A sum of weights of the trimethylolpropane ethoxylate triacrylate (EO=3) and the trimethylolpropane triacrylate may be in a range of about 40 wt % or more to about 96 wt % or less based on the total weight of the composition for a soft mold. For example, the sum of weights of the trimethylolpropane ethoxylate triacrylate (EO=3) and the trimethylolpropane triacrylate may be in a range of about 80 wt % or more to about 96 wt % or less based on the total weight of the composition for a soft mold.

The composition for a soft mold according to the embodiment may include two first acrylate monomers and one second acrylate monomer as acrylate groups. For example, the composition for a soft mold according to the embodiment may include trimethylolpropane ethoxylate triacrylate (EO=3), trimethylolpropane triacrylate, and dipropylene glycol diacrylate. A sum of weights of the trimethylolpropane ethoxylate triacrylate (EO=3), the trimethylolpropane triacrylate, and the dipropylene glycol diacrylate may be in a range of about 40 wt % or more to about 96 wt % or less based on the total weight of the composition for a soft mold. For example, the sum of the weights of the trimethylolpropane ethoxylate triacrylate (EO=3), the trimethylolpropane triacrylate, and the dipropylene glycol diacrylate may be in a range of about 80 wt % or more to about 96 wt % or less based on the total weight of the composition for a soft mold.

The composition for a soft mold according to the embodiment may further include a multifunctional acrylate oligomer. The multifunctional acrylate oligomer may include the repeating unit of the above-described multifunctional acrylate monomer.

The composition for a soft mold according to the embodiment may further include about 3 wt % or more to about 15 wt % or less of the at least one photoinitiator based on the total weight of the composition for a soft mold. Specifically, the composition for a soft mold according to the embodiment may include about 5 wt % or more to about 15 wt % or less of the at least one photoinitiator based on the total weight of the composition for a soft mold.

The composition for a soft mold according to the embodiment may further include a plurality of the photoinitiators. The composition for a soft mold according to the embodiment may include a first photoinitiator activated by a first ultraviolet light and a second photoinitiator activated by a second ultraviolet light. The second ultraviolet light may be an ultraviolet light having a center wavelength longer than that of the first ultraviolet light.

For example, the first ultraviolet light is light having a center wavelength of about 345 nm in the ultraviolet wavelength range, and the second ultraviolet light is light having a center wavelength of about 365 nm in the ultraviolet wavelength range.

The composition for a soft mold according to the embodiment may include the first photoinitiator and the second photoinitiator at a ratio of 1:1 to 2:1. A sum of weights of the first photoinitiator and the second photoinitiator may be in a range of about 3 wt % or more to about 15 wt % or less based on the total weight of the composition for a soft mold, and, for example, the sum of the weights of the first photoinitiator and the second photoinitiator may be in a range of about 5 wt % or more to about 15 wt % or less based on the total weight of the composition for a soft mold.

In an embodiment, the first photoinitiator may be included in an amount of about 1.5 wt % or more to about 12 wt % or less based on the total weight of the composition for a soft mold, and the second photoinitiator may be included in an amount of about 1.5 wt % or more to about 3 wt % or less based on the total weight of the composition for a soft mold.

In a case in which the at least one photoinitiator is included in an amount of less than about 3 wt % in the composition for a soft mold according to the embodiment, since polymerization reactivity of the multifunctional acrylate monomer is low, a polymerization reaction may not sufficiently occur. Also, in a case in which the at least one photoinitiator is included in an amount of greater than about 15 wt % in the composition for a soft mold according to the embodiment, compatibility of the photoinitiator with the multifunctional acrylate monomer may be reduced.

In a case in which the composition for a soft mold according to the embodiment includes both of the first photoinitiator and the second photoinitiator, when the second photoinitiator is included in an amount of less than about 1.5 wt %, a degree of polymerization of the multifunctional acrylate monomer may be reduced, and, when the second photoinitiator is included in an amount of greater than about 3 wt %, compatibility of the second photoinitiator with the multifunctional acrylate monomer may be reduced.

The first photoinitiator may be an alkylphenone-based photoinitiator. The second photoinitiator may be an alkylphenone-based photoinitiator, an acylphosphineoxide-based photoinitiator, an oxime ester-based photoinitiator, or a titanocene-based photoinitiator.

The first photoinitiator may be one selected from the group consisting of 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, 2-hydroxy-1-{4-[4-(2-hydroxy-2-methyl-propionyl)-benzyl]-phenyl}-2-methylpropan-1-one, and a combination thereof.

The second photoinitiator may be one selected from the group consisting of 2-methyl-1[4-(methylthio)phenyl]-2-morpholinopropan-1-one, 2-benzyl-2-dimethylamino-1-(4-morpholinophenyl)-butanone-1,2-dimethyl amino-2-(4-methyl-benzyl)-1-(4-morpholin-4-yl-phenyl)-butan-1-one, 2,4,6-trimethylbenzoyl-diphenylphosphine oxide, 2,4,6-trimethylbenzoyl-diphenyl phosphinate, bis(2,4,6-trimethylbenzoyl)-phenylphosphine oxide, 1-(4-phenylsulfanylbenzoyl)heptylideneaminolbenzoate, [1-[9-ethyl-6-(2-methylbenzoyl)carbazol-3-yl]ethylideneamino] acetate, bis(2,4-cyclopentadienyl)bis[2,6-difluoro-3-(1-pyrryl)phenyl] titanium (IV), and a combination thereof.

For example, the composition for a soft mold according to the embodiment may include 1-hydroxy-cyclohexyl-phenyl-ketone, as the first photoinitiator, and may include bis(2,4,6-trimethylbenzoyl)-phenylphosphine oxide as the second photoinitiator. Specifically, the composition for a soft mold according to the embodiment may include about 1.5 wt % or more to about 12 wt % or less of the 1-hydroxy-cyclohexyl-phenyl-ketone and about 1.5 wt % or more to about 3 wt % or less of the bis(2,4,6-trimethylbenzoyl)-phenylphosphine oxide based on the total weight of the composition for a soft mold. The composition for a soft mold according to the embodiment may include about 6 wt % of the 1-hydroxy-cyclohexyl-phenyl-ketone and about 3 wt % of the bis(2,4, 6-trimethylbenzoyl)-phenylphosphine oxide based on the total weight of the composition for a soft mold.

The composition for a soft mold according to the embodiment may increase the degree of polymerization of the multifunctional acrylate monomer by including both of the first photoinitiator and the second photoinitiator. Since the composition for a soft mold according to the embodiment may increase the polymerization reactivity of the multifunctional acrylate monomer by simultaneously including the first photoinitiator and the second photoinitiator, the composition for a soft mold according to the embodiment may increase durability of a soft mold manufactured by using the composition for a soft mold according to the embodiment.

The composition for a soft mold according to the embodiment may include a siloxane compound. The composition for a soft mold according to the embodiment may include about 0.1 wt % or more to about 50 wt % or less of the siloxane compound based on the total weight of the composition for a soft mold. For example, the composition for a soft mold according to the embodiment may include about 2 wt % or more to about 10 wt % or less of the siloxane compound based on the total weight of the composition for a soft mold.

In an embodiment, the siloxane compound may have an acrylate group as an end group. For example, the siloxane compound may be a siloxane polymer having an acrylate group as an end group. Specifically, the siloxane compound may be a siloxane polymer having an acrylate group at both ends.

The siloxane compound included in the embodiment may be represented by the following Formula 1.

CH$_2$CXCOO$-$($-$CH$_2$CH$_2$O$-$)$_{n2}$($-$CH$_2$$-$)$_{m2}$O$-$($-$Si (CH$_3$)$_2$$-$O$-$)$-$($-$CH$_2$$-$)$_{m1}$($-$OCH$_2$CH$_2$$-$)$_{n1}$ OOCCXCH$_2$ [Formula 1]

In Formula 1, X is hydrogen or a methyl group, m1 and m2 are each independently an integer of 2 or more to 30 or less, and n1 and n2 are each independently an integer of 0 or more to 5 or less.

Referring to Formula 1, the siloxane compound included in the embodiment may have a siloxane group, as a core, and an acrylate group at both ends. The siloxane compound included in the embodiment and represented by Formula 1 may have a molecular weight of about 204 g/mol or more to about 3,500 g/mol or less.

In the siloxane compound represented by Formula 1, m1 and m2 may be the same integer, and n1 and n2 may be the same integer, but the embodiment of the inventive concept is not limited thereto. For example, m1 and m2 may be different integers, and n1 and n2 may be different integers.

The siloxane compound included in the embodiment may be represented by the following Formula 1-1 or Formula 1-2.

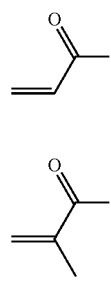

[Formula 1-1]

[Formula 1-2]

In Formulae 1-1 and 1-2, m1 and m2 are each independently an integer of 2 or more to 30 or less, and n1 and n2 are each independently an integer of 0 or more to 5 or less.

In the composition for a soft mold according to the embodiment, the siloxane compound may function as a release material. In an embodiment, in a case in which the siloxane compound is included in an amount of less than about 0.1 wt %, since the siloxane compound may not sufficiently function as a release material, a soft mold manufactured by using the composition for a soft mold may not exhibit good release properties. Also, in an embodiment, in a case in which the siloxane compound is included in an amount of greater than about 50 wt %, the durability of the soft mold may be reduced.

The composition for a soft mold according to the embodiment may include a siloxane compound represented by the following Formula 1-3.

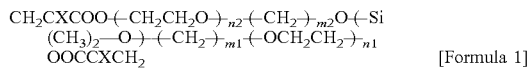

[Formula 1-3]

The composition for a soft mold according to the embodiment may include about 40 wt % or more to about 96 wt % or less of the at least one multifunctional acrylate monomer, about 3 wt % or more to about 15 wt % or less of the at least one photoinitiator, and about 0.1 wt % or more to about 50 wt % or less of the siloxane compound.

For example, the composition for a soft mold according to the embodiment may include about 80 wt % or more to about 96 wt % or less of the at least one multifunctional acrylate monomer, about 5 wt % or more to about 15 wt % or less of the at least one photoinitiator, and about 2 wt % or more to about 10 wt % or less of the siloxane compound.

In an embodiment, the composition for a soft mold may include about 80 wt % or more of the trimethylolpropane ethoxylate triacrylate (EO=3), about 1 wt % or more of the trimethylolpropane triacrylate, about 6 wt % or more of the 1-hydroxy-cyclohexyl-phenyl-ketone, about 3 wt % of the bis(2,4,6-trimethylbenzoyl)-phenylphosphine oxide, and about 2 wt % or more to about 10 wt % or less of the siloxane compound. A sum of weights of the trimethylolpropane ethoxylate triacrylate (EO=3) and the trimethylolpropane triacrylate may be about 96 wt % or less, and a sum of weights of the 1-hydroxy-cyclohexyl-phenyl-ketone and the bis(2,4,6-trimethylbenzoyl)-phenylphosphine oxide may be about 15 wt % or less.

Also, in an embodiment, the composition for a soft mold may include about 60 wt % or more of the dipropylene glycol diacrylate, about 20 wt % or more of the trimethylolpropane ethoxylate triacrylate (EO=3), about 1 wt % or more of the trimethylolpropane triacrylate, about 6 wt % or more of the 1-hydroxy-cyclohexyl-phenyl-ketone, about 3 wt % of the bis(2,4,6-trimethylbenzoyl)-phenylphosphine oxide, and about 2 wt % or more to about 10 wt % or less of the siloxane compound. A sum of weights of the dipropylene glycol diacrylate, the trimethylolpropane ethoxylate triacrylate (EO=3), and the trimethylolpropane triacrylate may be about 96 wt % or less, and a sum of weights of the 1-hydroxy-cyclohexyl-phenyl-ketone and the bis(2,4,6-trimethylbenzoyl)-phenylphosphine oxide may be about 15 wt % or less.

The composition for a soft mold according to the embodiment may further include a surfactant. In an embodiment, the surfactant may include a phosphonic acid. In an embodiment, the composition for a soft mold may include a phosphonic acid having a fluorocarbon chain or a phosphonic acid having an alkyl chain. The embodiment may further include about 1 wt % or less of the phosphonic acid based on the total weight of the composition for a soft mold.

The composition for a soft mold according to the embodiment may further improve the release properties of the soft mold with respect to a master mold to be described later by further including the phosphonic acid as the surfactant.

Since the above-described composition for a soft mold according to the embodiment includes the multifunctional acrylate monomer and the siloxane compound, the composition for a soft mold according to the embodiment may be used in the manufacture of a soft mold having a low release force value as well as high elastic modulus and hardness. Also, a soft mold having high durability and chemical resistance may be manufactured by using the composition for a soft mold according to the embodiment.

Hereinafter, a soft mold manufactured by using the above-described composition for a soft mold according to the embodiment will be described. In descriptions of the soft mold according to an embodiment, the descriptions overlapping with those described in the above-described composition for a soft mold according to the embodiment will not be repeated, and points different therefrom will be mainly described.

FIGS. 1A to 1D are schematic views illustrating steps of manufacturing a soft mold by using the composition for a soft mold according to the embodiment.

FIG. 1A illustrates a step of providing a composition SR for a soft mold to a master mold HM according to an embodiment. The above-described composition SR for a soft mold according to the embodiment may be provided to the master mold HM through a supply nozzle SN1. The master mold HM may be formed of a metallic material. The master mold HM may include a nanopattern correspond to a shape of a soft mold to be manufactured. The provided composition SR for a soft mold may be filled in a recessed portion of the nanopattern formed in the master mold HM. In this case, the composition SR for a soft mold provided to the master mold HM may be the above-described composition for a soft mold according to the embodiment.

Specifically, the composition SR for a soft mold may include at least one multifunctional acrylate monomer, at least one photoinitiator, and a siloxane compound. In the composition SR for a soft mold, the at least one photoinitiator may include a first photoinitiator activated by a first ultraviolet light and a second photoinitiator activated by a second ultraviolet light having a wavelength longer than that of the first ultraviolet light.

That is, in an embodiment, the composition for a soft mold may include a plurality of the multifunctional acrylate monomers, a plurality of the photoinitiators, and the siloxane compound.

Also, the composition SR for a soft mold may include about 40 wt % or more to about 96 wt % or less of the at least one multifunctional acrylate monomer, about 3 wt % or more to about 15 wt % or less of the at least one photoinitiator, and about 0.1 wt % or more to about 50 wt % or less of the siloxane compound.

Figure 1B:
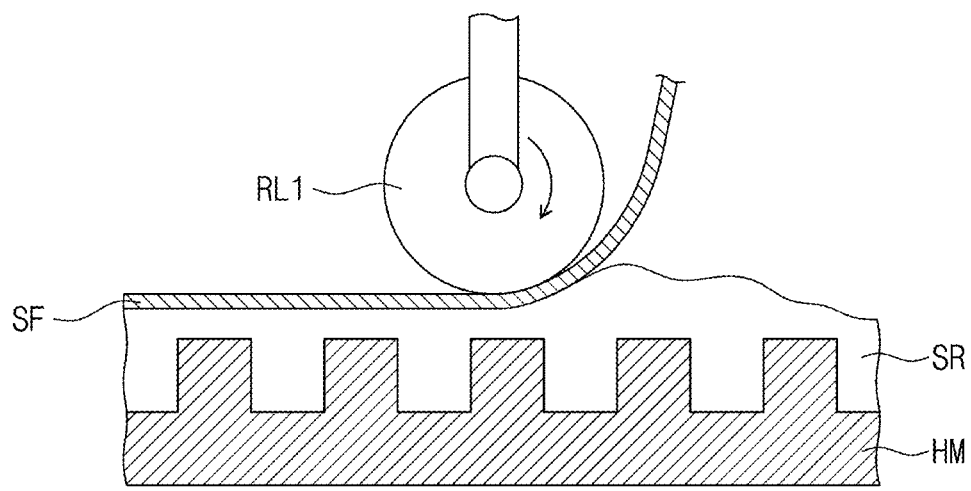

FIG. 1B illustrates a step of planarizing a surface of the provided composition SR for a soft mold. A thickness of the composition SR for a soft mold disposed on the master mold HM may be flattened to have uniform thickness by using a roller RL1. A base film SF may be further provided on the provided composition SR for a soft mold. The base film SF may be formed of a polymer resin. For example, the base film SF may be a transparent polymer film. For example, the base film SF may be formed by including polyethylene terephthalate. The base film SF may function as a support configured to support the composition SR for a soft mold.

Figure 1C:
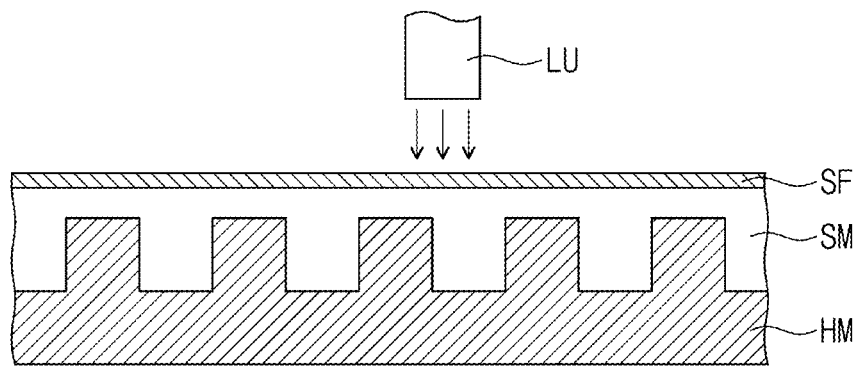

FIG. 1C illustrates a step of curing the provided composition SR (see FIG. 1B) for a soft mold. A soft mold SM according to an embodiment may be manufactured by curing the composition SR (see FIG. 1B) for a soft mold provided on the master mold HM using ultraviolet light provided from an external light source LU. In this case, the external light source LU may provide both of the first ultraviolet light having a center wavelength of about 345 nm and the second ultraviolet light having a center wavelength of about 365 nm.

Figure 1D:
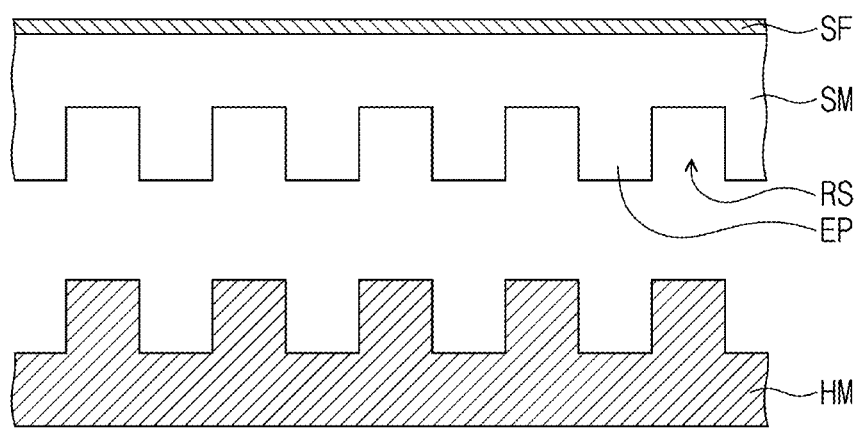

FIG. 1D illustrates a step of separating the manufactured soft mold SM according to the embodiment from the master mold HM after the ultraviolet curing step described in FIG. 1C. Since the soft mold SM according to the embodiment has high durability and good release properties by being manufactured using the above-described composition for a soft mold according to the embodiment which includes the multifunctional acrylate monomer and the siloxane compound, the soft mold SM according to the embodiment may be easily separated from the master mold HM without a defective portion.

The soft mold SM according to the embodiment manufactured by the above-described steps of FIGS. 1A to 1D may include an uneven pattern. The soft mold SM according to the embodiment may include an uneven pattern having a plurality of recesses RS. The soft mold SM according to the embodiment may include an uneven pattern having a protrusion EP disposed between the plurality of recesses RS. The uneven pattern having the plurality of recesses RS may be a nano-sized pattern. For example, a width of the recess RS of the uneven pattern, a spacing between the plurality of recesses RS, and a depth of the plurality of recesses RS may be in a range of a few nanometers to a few hundreds of nanometers, respectively.

FIGS. 2A to 2E are schematic views illustrating steps of manufacturing an optical member by using the soft mold according to the embodiment. For example, the optical member manufactured in FIGS. 2A to 2E may be a wire-grid polarizing layer.

Figure 2A:
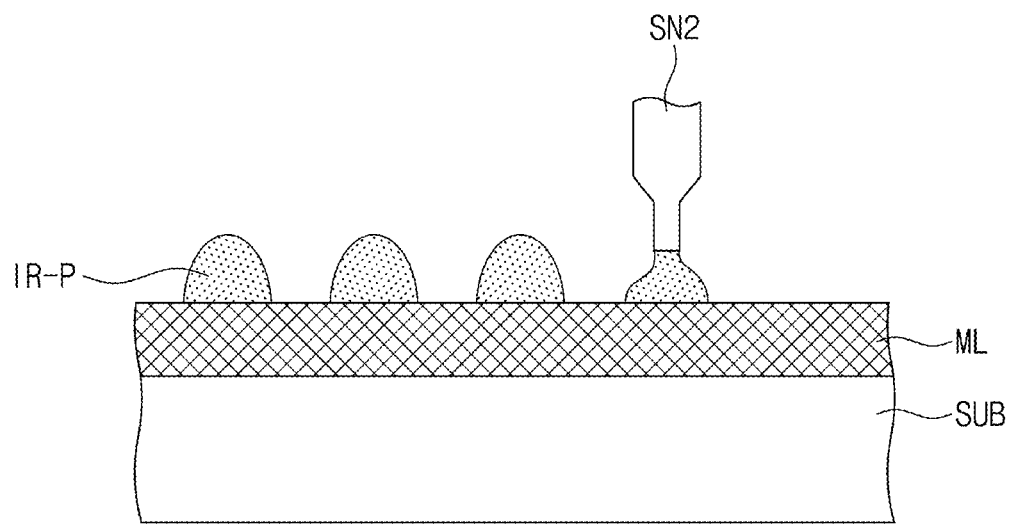
FIGS. 2A, 2B, 2C, 2D, and 2E are schematic views illustrating steps of manufacturing an optical member by using the soft mold according to the embodiment of the inventive concept.

FIG. 2A illustrates a step of providing a resin IR-P for pattern formation to a substrate on which a metal layer is formed on the substrate. The resin IR-P for pattern formation may be provided through a resin supply unit SN2. The resin supply unit SN2 may be in the form of a nozzle configured to coat a predetermined amount of the resin IR-P for pattern formation on an area requiring pattern formation for the manufacture of the optical member. However, the embodiment of the inventive concept is not limited thereto, and the resin IR-P for pattern formation may be provided by using various coating methods.

In FIG. 2A, a substrate SUB may be a support member on which the optical member is disposed. The substrate SUB may be a glass substrate, but the embodiment of the inventive concept is not limited thereto. For example, the substrate SUB may be a plastic substrate formed of a polymer resin, or may be an array substrate of a display device. A metal layer ML may be provided on the substrate SUB. The metal layer ML, for example, may include aluminum (Al), but the embodiment of the inventive concept is not limited thereto. Referring to FIG. 2A, the resin IR-P for pattern formation may be provided on the metal layer ML. For example, the resin IR-P for pattern formation may be a photoresist.

Figure 2B:
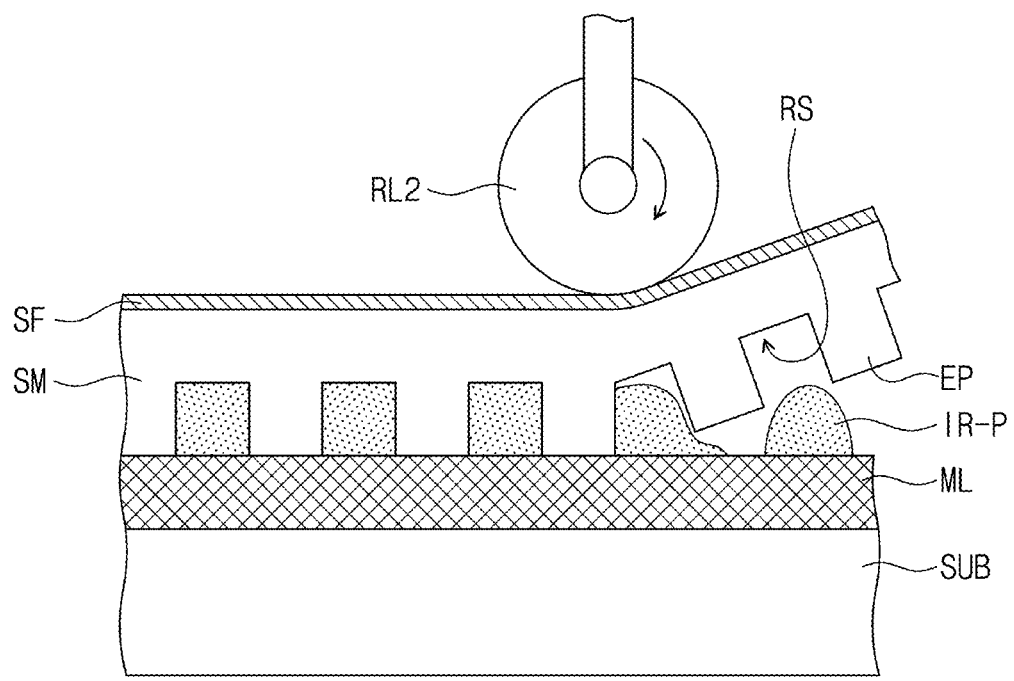

FIG. 2B illustrates a step of providing the soft mold SM according to the embodiment on the provided resin IR-P for pattern formation. The resin IR-P for pattern formation coated on the substrate SUB may be filled in the recess RS of the soft mold SM. While a pressure roller RL2 is disposed on the soft mold SM and moves, the pressure roller RL2 may allow the soft mold SM to be disposed on the substrate SUB having the metal layer ML.

Figure 2C:
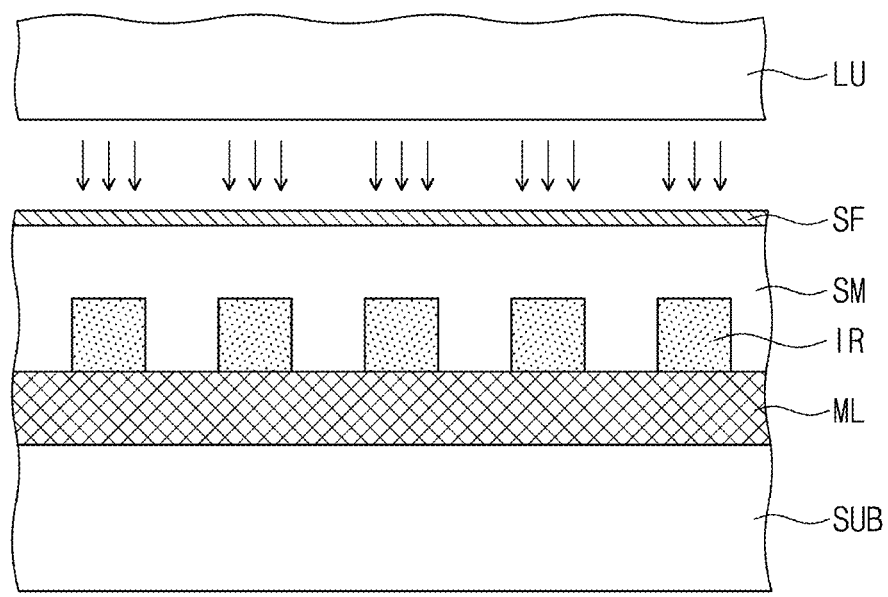

FIG. 2C illustrates a step of photocuring the resin IR-P (see FIG. 2A) for pattern formation provided in FIG. 2A. An external light source LU may be disposed on the soft mold SM. The external light source LU may provide an ultraviolet light which penetrates the soft mold SM and cures the resin IR-P (see FIG. 2A) for pattern formation to form a temporary pattern IR, for example, a etch mask. The temporary pattern IR, which is obtained by photocuring the resin IR-P (see FIG. 2A) for pattern formation, may be formed on the metal layer ML. A width of the temporary pattern IR may have a size corresponding to a width of the recess RS (see FIG. 2B) of the soft mold SM.

Figure 2D:
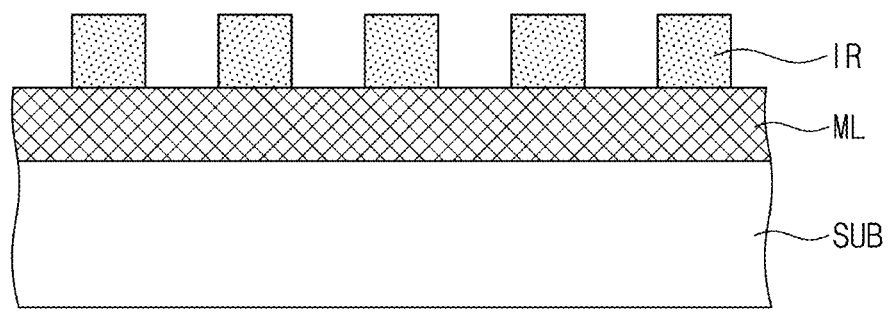

FIG. 2D illustrates a state in which the soft mold SM (see FIG. 2C) according to the embodiment is removed. Since the soft mold SM (see FIG. 2C) according to the embodiment has good release properties by being manufactured by using the composition for a soft mold which includes the multifunctional acrylate monomer and the siloxane compound, the soft mold SM according to the embodiment may be easily detached from the temporary pattern IR.

Figure 2E:
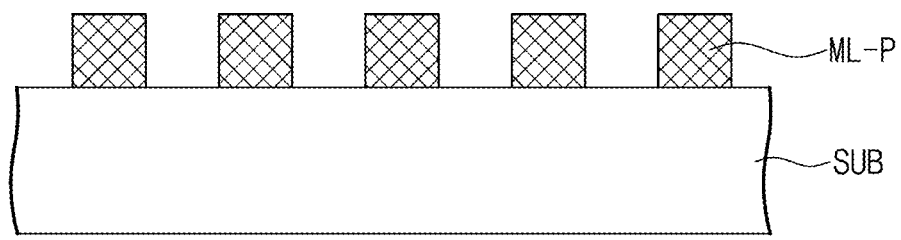

FIG. 2E illustrates an optical pattern ML-P formed on the substrate SUB. The optical pattern ML-P may be formed by etching the metal layer ML using the temporary pattern IR of FIG. 2D as a mask. For example, the optical pattern ML-P formed on the substrate SUB in FIG. 2E may illustrate a fine pattern of the wire-grid polarizing layer. That is, since the soft mold SM (see FIG. 2C) according to the embodiment has high elastic modulus and low release force, the soft mold SM (see FIG. 2C) may form the good temporary pattern IR and the optical member thus manufactured may also have the good optical pattern ML-P.

Since the composition for a soft mold according to the embodiment includes the multifunctional acrylate monomer and the siloxane compound, a soft mold having a low release force as well as high hardness and elastic modulus may be manufactured. Also, since the soft mold according to the embodiment has excellent durability and good release properties, the soft mold according to the embodiment may be easily detached from the temporary pattern IR even if the number of uses increases, and thus, productivity during the formation of the optical pattern may be increased.

Hereinafter, the soft mold according to the embodiment manufactured by using the composition for a soft mold according to the embodiment of the inventive concept will be described in detail with reference to examples and comparative example. Also, the following examples are merely provided to allow for a clearer understanding of the present inventive concept rather than to limit the scope thereof.

Examples

1. Manufacture of Soft Mold

A composition for a soft mold was provided to a master mold, and the provided composition for a soft mold was photocured with ultraviolet light to manufacture a soft mold. An ultraviolet light having a center wavelength of about 345 nm and an ultraviolet light having a center wavelength of about 365 nm were provided to the provided composition for a soft mold.

2. Evaluation of Soft Mold

Release force and durability of the soft mold manufactured by the above-described method of manufacturing a soft mold were evaluated. With respect to the release force, initial release force and release force according to the number of uses of the soft mold were respectively evaluated.

The durability of the soft mold was evaluated by hardness and elastic modulus. The hardness and elastic modulus were measured with a nano-indenter. During the measurement of the hardness and elastic modulus, measurement samples were prepared to have a thickness of about 2 μm.

Figure 3:
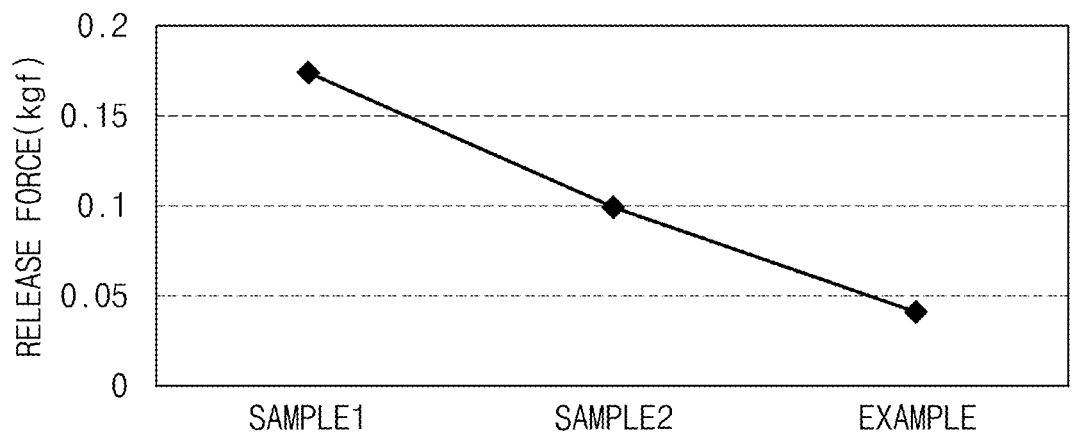
FIG. 3 is a graph illustrating results of release force tests for soft molds.

Table 1 and FIG. 3 illustrate evaluation results of the release forces of the composition for a soft mold according to an embodiment and samples for comparison. In Table 1 and FIG. 3, Example illustrates the results of the soft mold manufactured by using the composition for a soft mold according to the embodiment, and Samples 1 and 2 respectively illustrate the results of release force tests for cases in which compositions for a soft mold did not include a siloxane compound. An acrylate monomer used in Example and Samples 1 and 2 listed in Table 1 was trimethylolpropane ethoxylate triacrylate (EO=3), and a monomer used in Example was trimethylolpropane ethoxylate triacrylate (EO=3) and trimethylolpropane triacrylate.

Also, 1-hydroxy-cyclohexyl-phenyl-ketone was used as a first photoinitiator, and bis(2,4,6-trimethylbenzoyl)-phenyl-phosphine oxide was used as a second photoinitiator. Furthermore, a siloxane compound represented by the following Formula 1-3 was used as a siloxane compound.

[Formula 1-3]

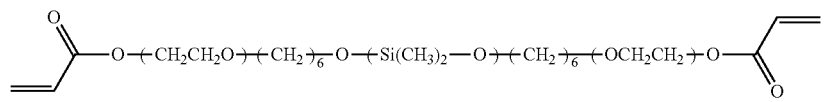

TABLE 1

| Category | Composition configuration (wt %) | | | | Release force (kgf) |
| --- | --- | --- | --- | --- | --- |
| | Acrylate monomer | First photo-initiator | Second photo-initiator | Siloxane compound | |
| Example | 89 | 6 | 3 | 2 | 0.041 |
| Sample 1 | 96 | 2 | 2 | 0 | 0.175 |
| Sample 2 | 91 | 6 | 3 | 0 | 0.1 |

Referring to the results of Table 1 and FIG. 3, it may be understood that Example manufactured by using the composition for a soft mold according to the embodiment including the siloxane compound exhibited a lower release force value than those of Samples 1 and 2 for comparison. In contrast, it may be confirmed that Samples 1 and 2, which did not include the siloxane compound, exhibited higher release force values than that of Example.

Samples 1 and 2 corresponded cases in which configurations of the compositions were the same and ratios of the two photoinitiators were different. Sample 2 was a case in which a total amount of the photoinitiators was greater than that of Sample 1, and, referring to the results of FIG. 3, it may be understood that the release force was reduced as the total amount of the photoinitiators was increased.

Figure 4:
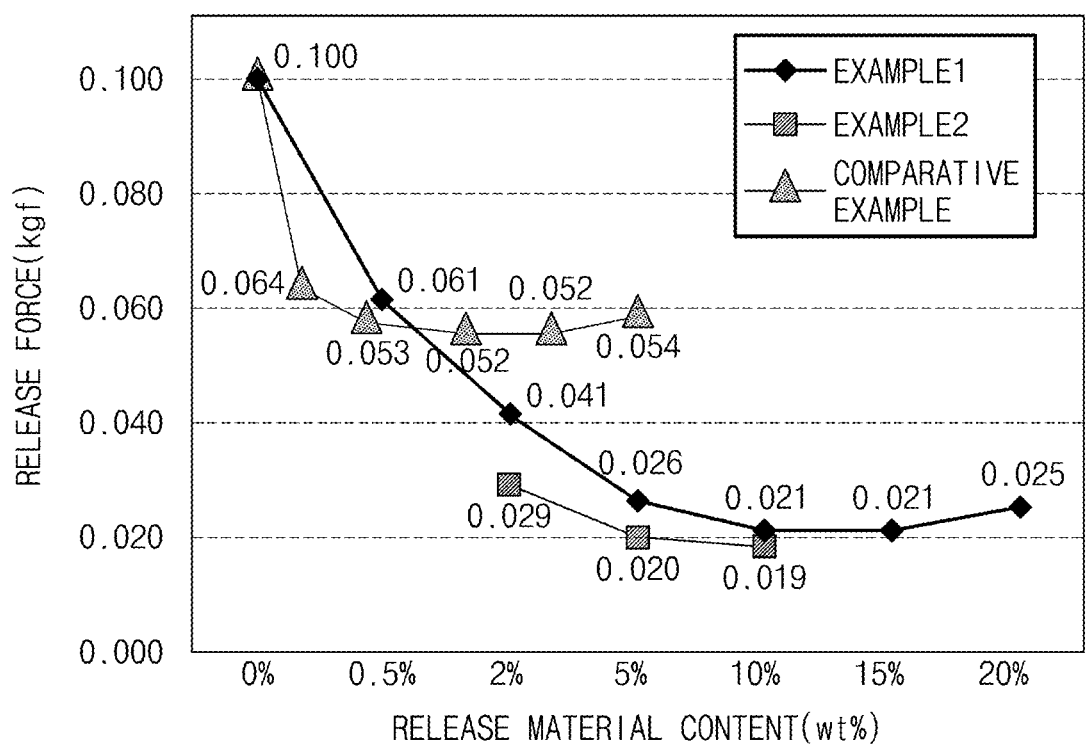
FIG. 4 is a graph illustrating results of release force tests for the soft mold according to the embodiment of the inventive concept depending on an amount of a siloxane compound.

FIG. 4 is a graph illustrating the release force values depending on the amount of a release material in the composition for a soft mold according to the embodiment. Composition ratios of the compositions for a soft mold, which were used in the manufacture of the soft molds of Examples and Comparative Example used in the release force evaluation illustrated in FIG. 4, are presented in Table 2.

TABLE 2

| Category | Composition configuration | | | |
| --- | --- | --- | --- | --- |
| | Acrylate monomer | First photoinitiator | Second photoinitiator | Release material |
| Example 1 | trimethylolpropane ethoxylate triacrylate (EO = 3), trimethylolpropane triacrylate | 1-hydroxy-cyclohexyl-phenyl-ketone | bis(2,4,6-trimethylbenzoyl)-phenylphosphine oxide | Siloxane compound |
| Example 2 | trimethylolpropane ethoxylate triacrylate (EO = 3), trimethylolpropane triacrylate, dipropylene glycol diacrylate | 1-hydroxy-cyclohexyl-phenyl-ketone | bis(2,4,6-trimethylbenzoyl)-phenylphosphine oxide | Siloxane compound |
| Comparative Example | trimethylolpropane ethoxylate triacrylate (EO = 3), trimethylolpropane triacrylate | 1-hydroxy-cyclohexyl-phenyl-ketone | bis(2,4,6-trimethylbenzoyl)-phenylphosphine oxide | Fluorine-based release material |

In the compositions for a soft mold listed in Table 2, the first photoinitiators in Examples 1 and 2 and Comparative Example were each included in an amount of about 6 wt % based on a total weight of the composition for a soft mold, and second photoinitiators were each included in an amount of about 3 wt % based on the total weight of the composition for a soft mold.

A siloxane compound represented by the following Formula 1-3 was used as the siloxane compound in Examples 1 and 2.

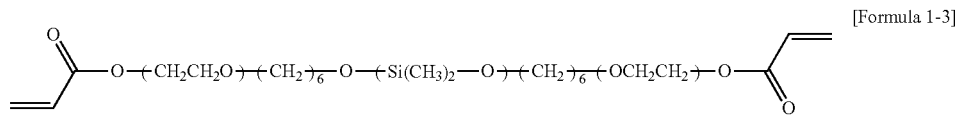

[Formula 1-3]

Example 2 was different from Example 1 in that Example 2 further included dipropylene glycol diacrylate as the acrylate monomer. A viscosity of the composition of Example 1 was about 60 cp or more, and Example 2 exhibited a low viscosity of about 20 cp or less by further including the diacrylate.

Referring to FIG. 4, it may be understood that the release force values of the soft molds were reduced as the amount of the siloxane compound was increased in both of Examples 1 and 2. In particular, when examining changes in the release force of Example 1, an effect of reducing the release force was significant even in a case in which about 0.5 wt % or less of the siloxane compound was added. In a case in which about 10 wt % or more of the siloxane compound was added, it may be understood that there was no significant change in the release force. In Examples 1 and 2, the release force values were reduced to about 0.02 kgf or less.

In contrast, a fluorine-based release material was used as the release material in Comparative Example. A release force value similar to that of Example 1 was obtained until the amount of the fluorine-based release material was 0.5 wt %, but, with respect to Comparative Example, the release force value was not reduced even if the amount of the release material was further increased from about 0.5 wt %.

Figure 5:
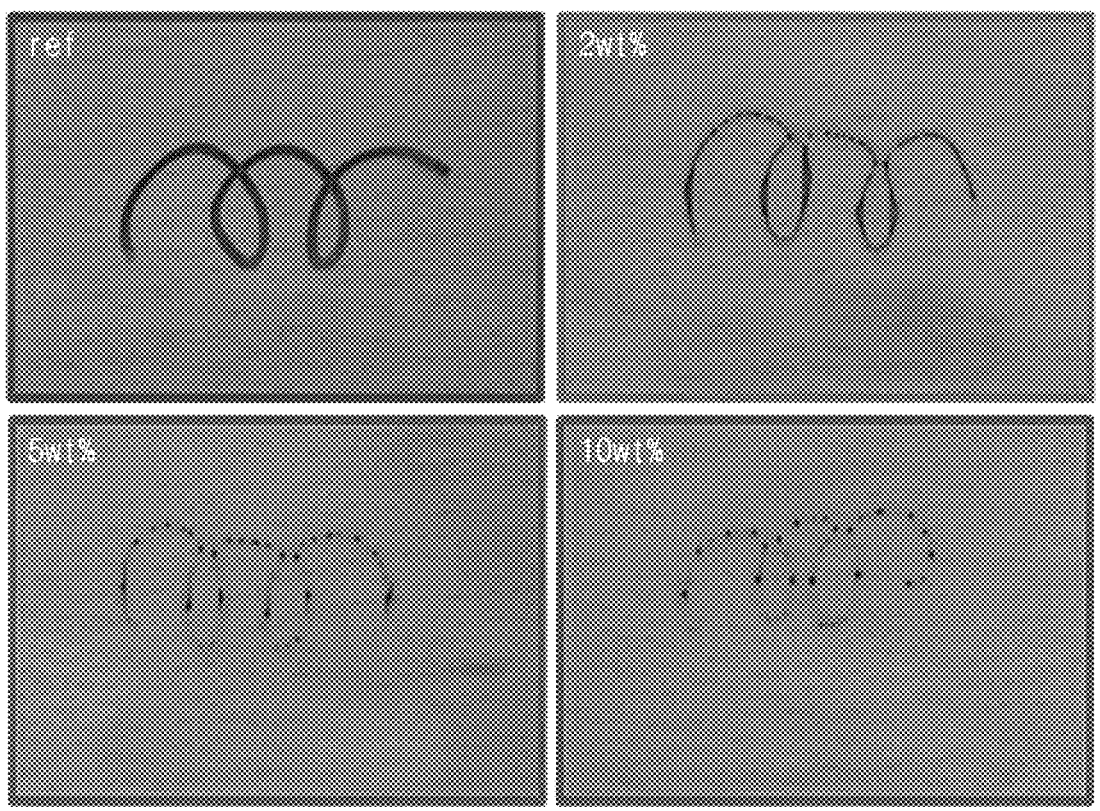
FIG. 5 illustrates surface conditions of soft molds of the embodiment of the inventive concept and comparative example.
Figure 6:
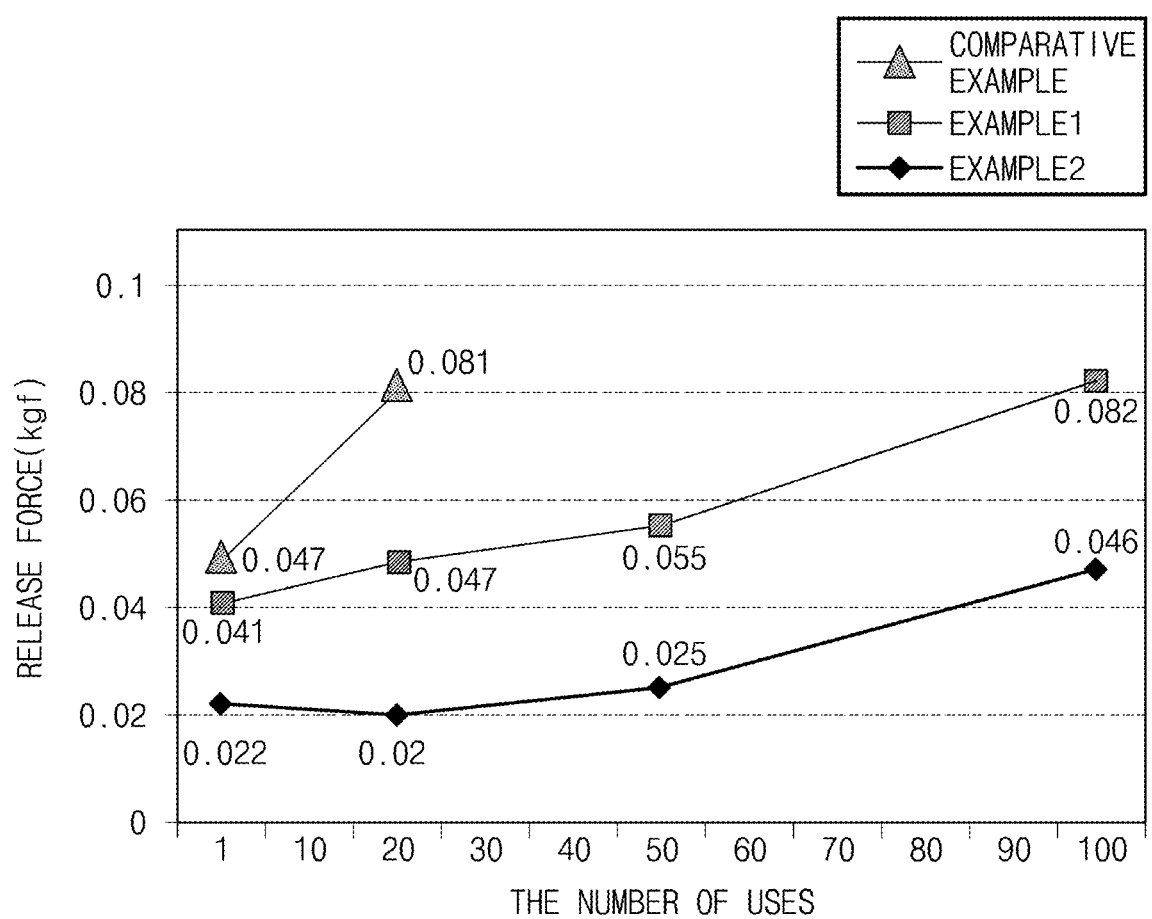
FIG. 6 illustrates changes in release force according to the number of uses.

FIG. 5 illustrates surface conditions of Example, in which a ratio of the siloxane compound in the composition for a soft mold according to the embodiment was changed, and Comparative Example, and FIG. 6 is a graph illustrating changes in the release force according to the number of uses in Examples, in which the ratio of the siloxane compound in the composition for a soft mold was changed, and Comparative Example.

Composition ratios of the compositions for a soft mold, which were used in the manufacture of the soft molds of Examples and Comparative Example used in FIG. 5 and the release force evaluation illustrated in FIG. 6, are presented in Table 3.

ane compound, water- or oil-repellent ability of the surface was excellent. In FIG. 5, 2 wt %, 5 wt %, and 10 wt % each denoted a weight ratio of the siloxane compound included in the composition for a soft mold, wherein it may be understood that surface wetting was decreased as the amount of the siloxane compound was increased.

That is, since the soft mold of Example had higher water- and oil-repellent abilities than Comparative Example (ref), the soft mold of Example may have low release force with respect to a pattern surface provided. Thus, the soft mold of Example may be easily removed from the pattern surface by a relatively small force in comparison to Comparative Example.

FIG. 6 illustrates changes in the release force according to the number of uses of the soft mold. It may be confirmed that, in Comparative Example and Examples, the release force values were increased as the number of uses was increased.

However, it may be understood that Examples 1 and 2 exhibited lower release force values than Comparative Example based on the same number of uses. Particularly, it may be understood that Example 2 exhibited a lower release force value than Example 1. The same result was obtained even in a case where the soft mold was used up to 100 times as well as a case where the soft mold was used once.

TABLE 3

| | Composition configuration | | | |
|---|---|---|---|---|
| Category | Acrylate monomer | First photoinitiator | Second photoinitiator | Release material |
| Example 1 | trimethylolpropane ethoxylate triacrylate (EO = 3), trimethylolpropane triacrylate | 1-hydroxy-cyclohexyl-phenyl-ketone | bis(2,4,6-trimethylbenzoyl)-phenylphosphine oxide | Siloxane compound |
| Example 2 | trimethylolpropane ethoxylate triacrylate (EO = 3), trimethylolpropane triacrylate, dipropylene glycol diacrylate | 1-hydroxy-cyclohexyl-phenyl-ketone | bis(2,4,6-trimethylbenzoyl)-phenylphosphine oxide | Siloxane compound |
| Comparative Example | trimethylolpropane ethoxylate triacrylate (EO = 3), trimethylolpropane triacrylate | 1-hydroxy-cyclohexyl-phenyl-ketone | bis(2,4,6-trimethylbenzoyl)-phenylphosphine oxide | Polydimethylsiloxane |

In Table 3, Examples 1 and 2 respectively had the same composition ratios as those of the compositions for a soft mold used in Examples 1 and 2 of Table 2. In Table 3, Comparative Example was different from Comparative Example of Table 2 in that polydimethylsiloxane was used as the release material.

FIG. 5 shows images illustrating surface wetting characteristics of the soft molds in Comparative Example and Example 1. The wetting characteristics were evaluated by a marking test on a surface of the manufactured soft mold using a permanent marker. With respect to Comparative Example (ref), a portion marked with the permanent marker on the surface of the soft mold was clearly observed, and, in the test of Example 1, it may be understood that Example 1 was not marked well with the permanent marker as the amount of the siloxane compound was increased. This indicated that, with respect to Example including the silox- That is, it may be confirmed that Example 2, which was manufactured by using the composition for a soft mold further including the diacrylate monomer, had better release properties than Example 1.

Since the composition for a soft mold according to the embodiment includes the siloxane compound having high compatibility with the acrylate monomer in comparison to the fluorine-based release material or polydimethylsiloxane used in Comparative Example, the relative amount of the release material based on the total weight of the composition for a soft mold may be increased, and, accordingly, the composition for a soft mold according to the embodiment may allow the soft mold to have a low release force value.

That is, since the composition for a soft mold includes the siloxane compound, the release force of the soft mold may be reduced, and thus, the soft mold may be easily detached from the formed pattern.

Figure 7A:
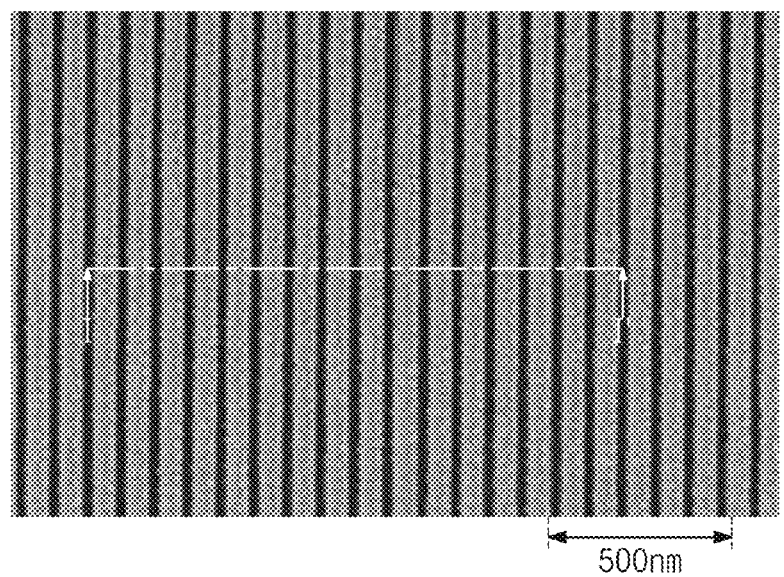
FIG. 7A is a scanning electron microscope (SEM) image of a surface of the soft mold according to the embodiment of the inventive concept.
Figure 7B:
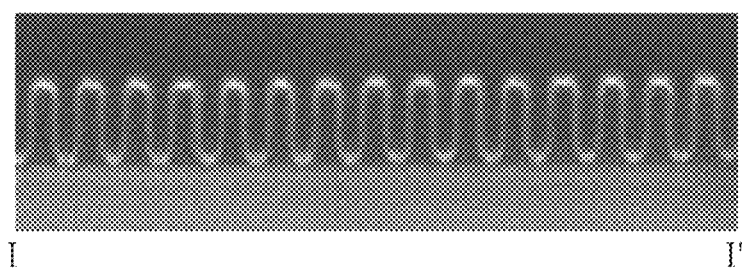
FIG. 7B is an SEM image of a cross section taken along line I-I' of FIG. 7A.
Figure 8A:
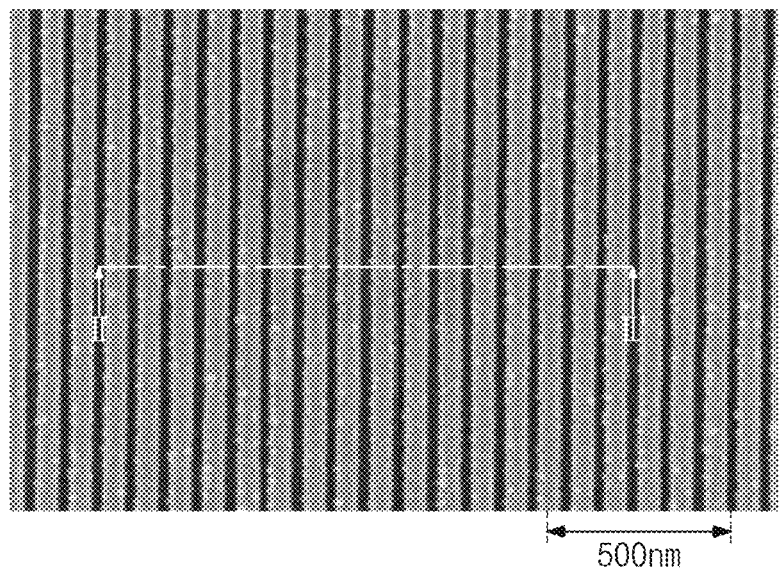
FIG. 8A is an SEM image of a surface of the soft mold according to the embodiment of the inventive concept.
Figure 8B:
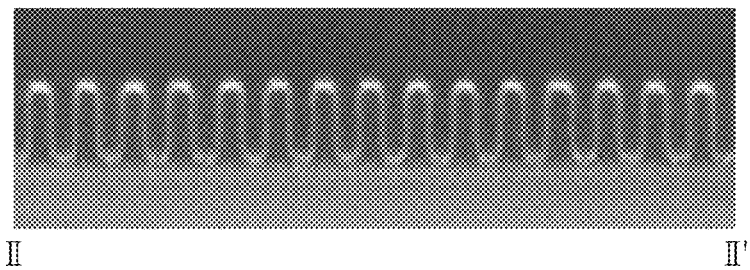
FIG. 8B is an SEM image of a cross section taken along line II-II' of FIG. 8A.

FIGS. 7A and 7B illustrate a shape of an optical pattern formed by using the soft mold according to the embodiment after using the soft mold for the first time. FIGS. 8A and 8B illustrate a shape of an optical pattern formed by using the soft mold according to the embodiment after using the soft mold 100 times.

FIG. 7A is a scanning electron microscope (SEM) image of a surface of the optical pattern formed by using the soft mold of Example 1, and FIG. 7B is an SEM image of a cross section taken along line I-I' of FIG. 7A. FIGS. 7A and 7B illustrate images of the optical pattern prepared by using the manufactured soft mold of Example 1 for the first time.

FIG. 8A is an SEM image of a surface of the optical pattern formed by using the soft mold of Example 1 which was used 100 times, and FIG. 8B is an SEM image of a cross section taken along line II-II' of FIG. 8A. Some debris was observed in the planar image of FIG. 8A, but it may be confirmed that the generally good shape of the optical pattern was observed in the cross-sectional image of FIG. 8B.

That is, it may be understood that the soft mold of Example exhibited excellent durability and good release properties even when the soft mold of Example was used more than 100 times.

Figure 9:
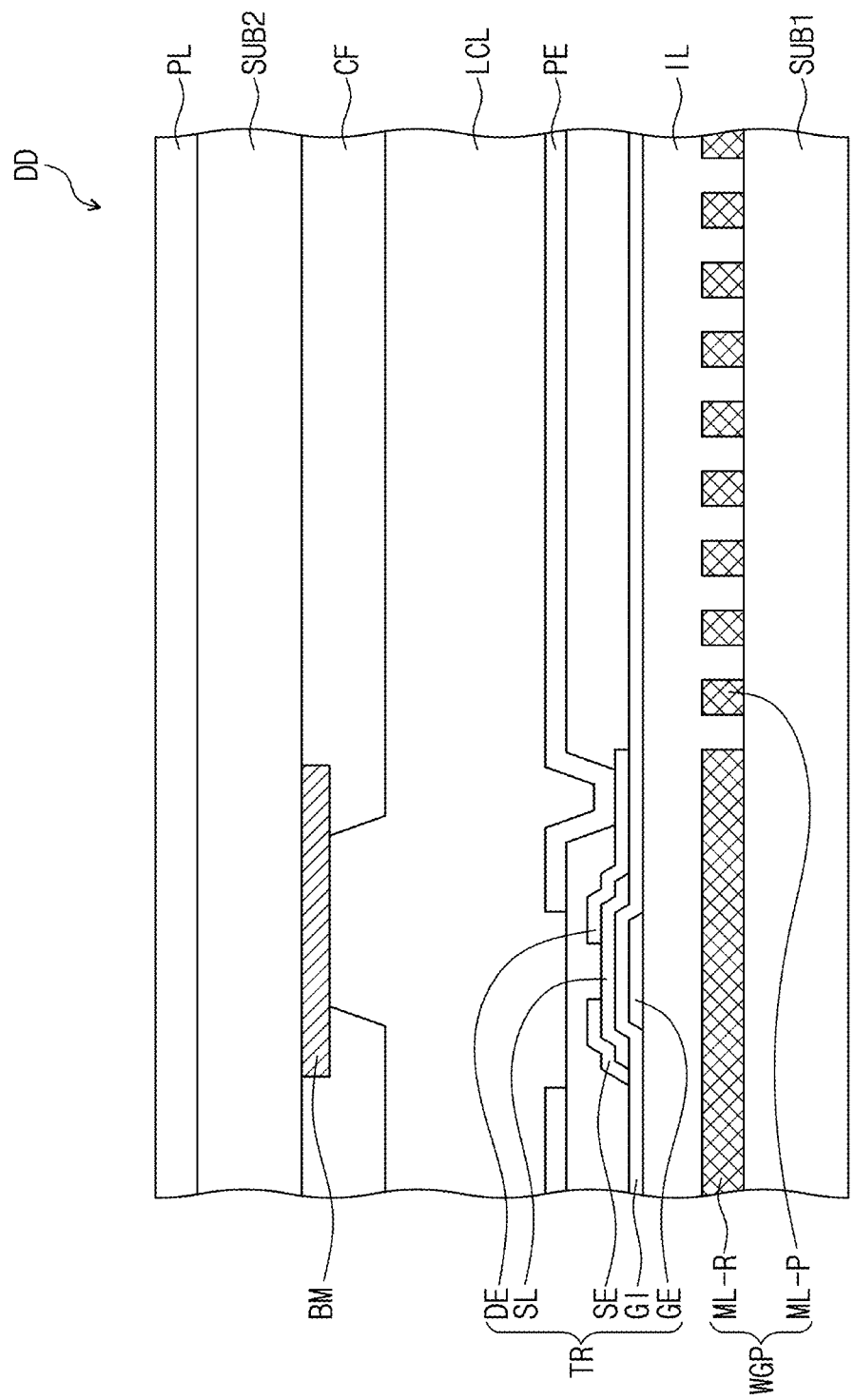
FIG. 9 is a cross-sectional view of a display device including a polarizing member manufactured by using the soft mold according to the embodiment of the inventive concept.

FIG. 9 is a cross-sectional view illustrating an embodiment of a display device including a wire-grid polarizing layer. A display device DD illustrated in FIG. 9 may include a wire-grid polarizing layer WGP formed on a top surface of a first substrate SUB 1. That is, the wire-grid polarizing layer WGP may be an in-cell type polarizing layer.

The display device DD illustrated in FIG. 9 may be a liquid crystal display device including the first substrate SUB 1, a second substrate SUB2 disposed to face the first substrate SUB 1, and a liquid crystal layer LCL disposed between the first substrate SUB 1 and the second substrate SUB2.

The wire-grid polarizing layer WGP including a nano-sized optical pattern ML-P may be disposed on the first substrate SUB 1. Also, the wire-grid polarizing layer WGP may further include a reflection pattern ML-R.

A base insulation layer IL configured to cover the wire-grid polarizing layer WGP and a pixel array disposed on the base insulation layer IL may be included on the first substrate SUB 1. The pixel array may include a thin film transistor TR and a pixel electrode PE. Also, the thin film transistor TR may include a gate electrode GE, a gate insulation layer GI, a semiconductor layer SL, a source electrode SE, and a drain electrode DE.

A color filter layer CF and a light-shielding layer BM may be disposed on one surface of the second substrate SUB2 facing the first substrate SUB 1.

In the wire-grid polarizing layer WGP, the optical pattern ML-P may be disposed corresponding to a display area of the display device DD, and the reflection pattern ML-R may be disposed corresponding to a non-display area. Referring to FIG. 9, the reflection pattern ML-R may be disposed corresponding to the thin film transistor TR.

Although not shown in FIG. 9, a backlight unit (not shown) may be disposed under the first substrate SUB 1 of the display device DD. Light provided from the backlight unit (not shown) through the first substrate SUB 1 may be polarized in the wire-grid polarizing layer WGP including the optical pattern ML-P.

In the display device DD illustrated in FIG. 9, a polarizing layer PL may be disposed on the second substrate SUB2. In FIG. 9, although it is illustrated that the polarizing layer PL is disposed on a top surface of the second substrate SUB2, the embodiment of the inventive concept is not limited thereto and the polarizing layer PL may be disposed on a bottom surface of the second substrate SUB2. That is, the polarizing layer PL may be an in-cell polarizing layer. The polarizing layer PL may have a polarizing axis perpendicular to the wire-grid polarizing layer WGP. The polarizing layer PL may be a film-type polarizing member or a coating-type polarizing layer. For example, the polarizing layer PL may be a polarizing film having a polarizer. Also, the polarizing layer PL may be formed by coating a material including a dichroic dye.

In the embodiment of the display device DD illustrated in FIG. 9, the wire-grid polarizing layer WGP may be formed by using the above-described soft mold according to the embodiment. Since the soft mold according to the embodiment had good release properties and high durability, productivity of the display device DD including the wire-grid polarizing layer WGP formed by using the soft mold may be improved.

The composition for a soft mold according to the embodiment may allow the soft mold to have a low release force value by including the siloxane compound. Also, the composition for a soft mold according to the embodiment may improve the durability of the soft mold by including the at least one multifunctional acrylate monomer.

That is, since the soft mold manufactured by using the composition for a soft mold including the multifunctional acrylate monomer and the siloxane compound may have high durability and good release properties, the soft mold may be easily detached from a pattern formed by a master mold or a nano-imprint method, and thus, the number of repeated uses of the soft mold may be increased to improve productivity in an optical member manufacturing process.

A composition for a soft mold having good release properties even for repeated use by including an acrylate monomer having a multifunctional group and a siloxane compound may be provided.

Since a soft mold according to an embodiment of the inventive concept has high durability and good release properties, quality of an optical member manufactured by using the soft mold according to the embodiment of the inventive concept may be improved and productivity in the manufacture of the optical member may be improved.

Although the present inventive concept has been described with reference to the exemplary embodiments thereof, it will be appreciated by those skilled in the art that it is possible to modify and change the present inventive concept in various ways without departing from the spirit and scope of the present inventive concept as set forth in the following claims.

Therefore, the scope of the inventive concept is defined not by the detailed description of the inventive concept but by the appended claims.

What is claimed is:

1. A composition for a soft mold, the composition comprising:
   40 wt % or more to 96 wt % or less of at least one multifunctional acrylate monomer based on a total weight of the composition for the soft mold;
   3 wt % or more to 15 wt % or less of at least one photoinitiator based on the total weight of the composition for the soft mold; and
   0.1 wt % or more to 50 wt % or less of a siloxane compound based on the total weight of the composition for the soft mold, wherein the at least one photoinitiator comprises:
a first photoinitiator activated by a first ultraviolet light; and
a second photoinitiator activated by a second ultraviolet light having a wavelength longer than that of the first ultraviolet light, and
wherein a ratio of the first photoinitiator to the second photoinitiator is in a range of 1:1 to 2:1.

2. The composition for a soft mold of claim 1, wherein the at least one multifunctional acrylate monomer comprises a first acrylate monomer having three or more acrylate groups.

3. The composition for a soft mold of claim 2, wherein the at least one multifunctional acrylate monomer further comprises a second acrylate monomer having two acrylate groups.

4. The composition for a soft mold of claim 1, wherein the at least one multifunctional acrylate monomer comprises at least one selected from the group consisting of trimethylolpropane triacrylate, trimethylolpropane ethoxylate triacrylate, trimethylolpropane propoxylate triacrylate, ethoxylated glycerine triacrylate, glycerine (PO)m triacrylate (where m is an integer of 1 or more to 4 or less), pentaerythritol triacrylate, tris(2-hydroxyethyl)isocyanurate triacrylate, pentaerythritol (EO)n tetraacrylate (where n is an integer of 1 or more to 4 or less), ditrimethylolpropane tetraacrylate, pentaerythritol tetraacrylate, dipentaerythritol pentaacrylate, and dipentaerythritol hexaacrylate.

5. The composition for a soft mold of claim 4, wherein the at least one multifunctional acrylate monomer further comprises at least one selected from the group consisting of 1,4-butanediol diacrylate, 1,6-hexanediol diacrylate, 1,9-nonanediol diacrylate, 1,10-decanediol diacrylate, 1,6-hexanediol (EO)n diacrylate (where n is an integer of 1 or more to 4 or less), hydroxy pivalic acid neopentyl glycol diacrylate, dipropylene glycol diacrylate, tripropylene glycol diacrylate, polypropylene glycol diacrylate, diethylene glycol diacrylate, triethylene glycol diacrylate, tetraethylene glycol diacrylate, and polyethylene glycol diacrylate.

6. The composition for a soft mold of claim 1, wherein the at least one multifunctional acrylate monomer comprises trimethylolpropane ethoxylate triacrylate and trimethylolpropane triacrylate.

7. The composition for a soft mold of claim 1, wherein the at least one multifunctional acrylate monomer further comprises dipropylene glycol diacrylate.

8. The composition for a soft mold of claim 1, wherein the first photoinitiator is one selected from the group consisting of 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, 2-hydroxy-1-{4-[4-(2-hydroxy-2-methyl-propionyl)-benzyl]-phenyl}-2-methylpropan-1-one, and a combination thereof.

9. The composition for a soft mold of claim 1, wherein the second photoinitiator is one selected from the group consisting of 2-methyl-1[4-(methylthio)phenyl]-2-morpholinopropan-1-one, 2-benzyl-2-dimethylamino-1-(4-morpholinophenyl)-butanone-1, 2-dimethylamino-2-(4-methyl-benzyl)-1-(4-morpholin-4-yl-phenyl)-butan-1-one, 2,4,6-trimethylbenzoyl-diphenylphosphine oxide, 2,4,6-trimethylbenzoyl-diphenyl phosphinate, bis(2,4,6-trimethylbenzoyl)-phenylphosphine oxide, [1-(4-phenylsulfanylbenzoyl)heptylideneamino]benzoate, [1-[9-ethyl-6-(2-methylbenzoyl)carbazol-3-yl]ethylideneamino] acetate, bis(2,4-cyclopentadienyl)bis[2,6-difluoro-3-(1-pyrryl)phenyl] titanium(IV), and a combination thereof.

10. The composition for a soft mold of claim 1, wherein the at least one photoinitiator comprises an alkylphenone-based first photoinitiator and an acylphosphineoxide-based second photoinitiator.

11. The composition for a soft mold of claim 1, wherein the at least one photoinitiator comprises 1-hydroxy-cyclohexyl-phenyl-ketone and bis(2,4,6-trimethylbenzoyl)-phenylphosphine oxide.

12. The composition for a soft mold of claim 1, wherein the siloxane compound has an acrylate group as an end group.

13. The composition for a soft mold of claim 1, wherein the composition comprises:
80 wt % or more to 96 wt % or less of the at least one multifunctional acrylate monomer based on the total weight of the composition for the soft mold;
5 wt % or more to 15 wt % or less of the at least one photoinitiator based on the total weight of the composition for the soft mold; and
2 wt % or more to 10 wt % or less of the siloxane compound based on the total weight of the composition for the soft mold.

14. The composition for a soft mold of claim 1, further comprising a phosphonic acid.

15. A composition for a soft mold, the composition comprising:
at least one acrylate monomer having a plurality of acrylate groups;
a first photoinitiator activated by a first wavelength;
a second photoinitiator activated by a second wavelength longer than the first wavelength; and
a siloxane compound represented by Formula 1:

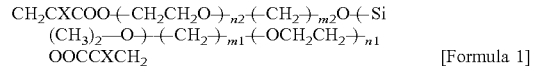   [Formula 1]

wherein, in Formula 1,
X is hydrogen or a methyl group, m1 and m2 are each independently an integer of 2 or more to 30 or less, and n1 and n2 are each independently an integer of 0 or more to 5 or less, and
wherein the composition comprising,
1.5 wt % or more to 12 wt % or less of the first photoinitiator based on the total weight of the composition for the soft mold; and
1.5 wt % or more to 3 wt % or less of the second photoinitiator based on the total weight of the composition for the soft mold.

16. The composition for a soft mold of claim 15, wherein Formula 1 is represented by Formula 1-1:

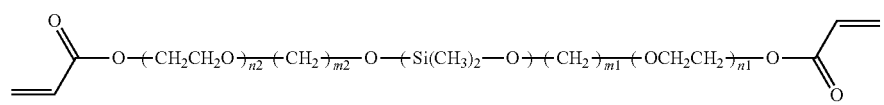

[Formula 1-1]

wherein, in Formula 1-1, m1, m2, n1, and n2 are the same as defined in claim 15.

17. The composition for a soft mold of claim 15, wherein Formula 1 is represented by Formula 1-2:

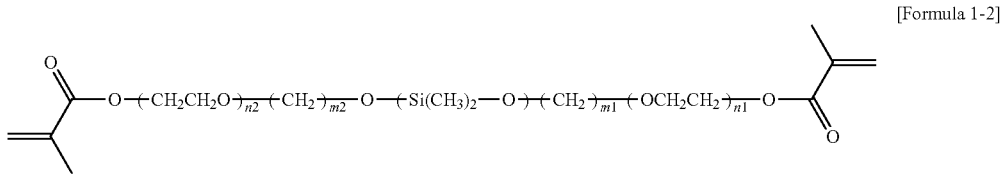

[Formula 1-2]

wherein, in Formula 1-2, m1, m2, n1, and n2 are the same as defined in claim 15.

18. The composition for a soft mold of claim 15, wherein Formula 1 is represented by Formula 1-3:

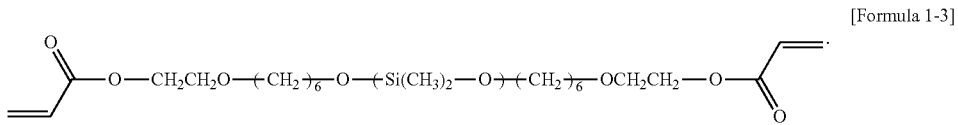

[Formula 1-3]

19. The composition for a soft mold of claim 15, wherein the composition comprises:
   40 wt % or more to 96 wt % or less of the at least one acrylate monomer based on a total weight of the composition for the soft mold;
   0.1 wt % or more to 50 wt % or less of the siloxane compound based on the total weight of the composition for the soft mold.

20. A soft mold comprising an uneven pattern having a plurality of recesses,
   wherein the uneven pattern is manufactured by using a composition for a soft mold which includes 40 wt % or more to 96 wt % or less of at least one multifunctional acrylate monomer based on a total weight of the composition;
   1.5 wt % or more to 12 wt % or less of a first photoinitiator based on the total weight of the composition for the soft mold;
   1.5 wt % or more to 3 wt % or less of a second photoinitiator based on the total weight of the composition for the soft mold; and
   0.1 wt % or more to 50 wt % or less of a siloxane compound based on the total weight of the composition.

21. The soft mold of claim 20, wherein the siloxane compound is represented by Formula 1:

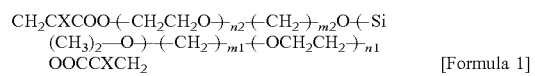

[Formula 1]

wherein, in Formula 1,
X is hydrogen or a methyl group, m1 and m2 are each independently an integer of 2 or more to 30 or less, and n1 and n2 are each independently an integer of 0 or more to 5 or less.

* * * * *